(12) United States Patent
Ramamoorthy et al.

(10) Patent No.: US 6,646,720 B2
(45) Date of Patent: Nov. 11, 2003

(54) EUV RETICLE CARRIER WITH REMOVABLE PELLICLE

(75) Inventors: Arun Ramamoorthy, Milpitas, CA (US); Hsing-Chien (Andy) Ma, Fremont, CA (US); Barry R. Lieberman, Los Altos, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/957,537

(22) Filed: Sep. 21, 2001

(65) Prior Publication Data

US 2003/0058424 A1 Mar. 27, 2003

(51) Int. Cl.$^7$ .................. G03B 27/58; G03B 27/42; B65D 85/48; G03F 9/00
(52) U.S. Cl. ............... 355/72; 355/53; 206/454; 430/5
(58) Field of Search ............... 355/53, 72, 73; 206/316.1, 454, 455, 557, 710; 430/5

(56) References Cited

U.S. PATENT DOCUMENTS

| | | | | |
|---|---|---|---|---|
| 4,511,038 A | * | 4/1985 | Miller et al. ............. 206/454 |
| 4,724,874 A | * | 2/1988 | Parikh et al. ............. 141/383 |
| 5,314,068 A | * | 5/1994 | Nakazato et al. .......... 206/454 |
| 5,397,665 A | * | 3/1995 | Tabuchi et al. ........... 428/421 |
| 5,399,398 A | * | 3/1995 | Toshimitsu et al. ........ 206/454 |
| 5,492,587 A | * | 2/1996 | Hong .................... 156/241 |
| 5,547,328 A | * | 8/1996 | Bonora et al. ........... 414/217.1 |
| 6,216,873 B1 | * | 4/2001 | Fosnight et al. .......... 206/454 |
| 6,300,019 B1 | * | 10/2001 | Ikeda et al. .............. 430/30 |
| 6,364,595 B1 | * | 4/2002 | Bonora et al. ............ 294/106 |

FOREIGN PATENT DOCUMENTS

JP 3-269535 * 12/1991

* cited by examiner

Primary Examiner—Alan A. Mathews
(74) Attorney, Agent, or Firm—Blakely, Sokoloff, Taylor & Zafman LLP

(57) ABSTRACT

A reticle carrier used in semiconductor manufacture. The carrier includes a bottom cover and a top cover having a transparent window. A protective lid may also be included. The box includes ports to allow nitrogen gas to enter and purge the inside. The transparent window is used for inspection and photochemical clean. However, since no material is available which can suitably handle smaller wavelength radiation, the reticle is removed from the carrier when exposure at these wavelengths is required.

19 Claims, 1 Drawing Sheet

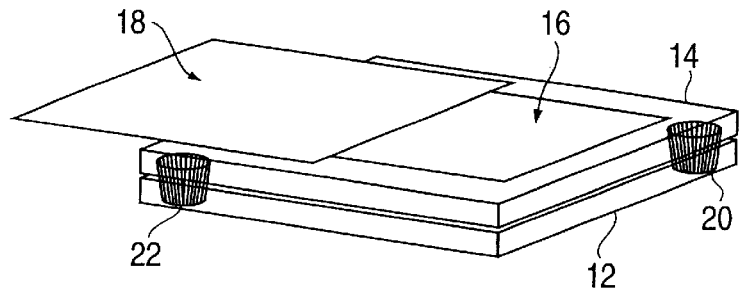
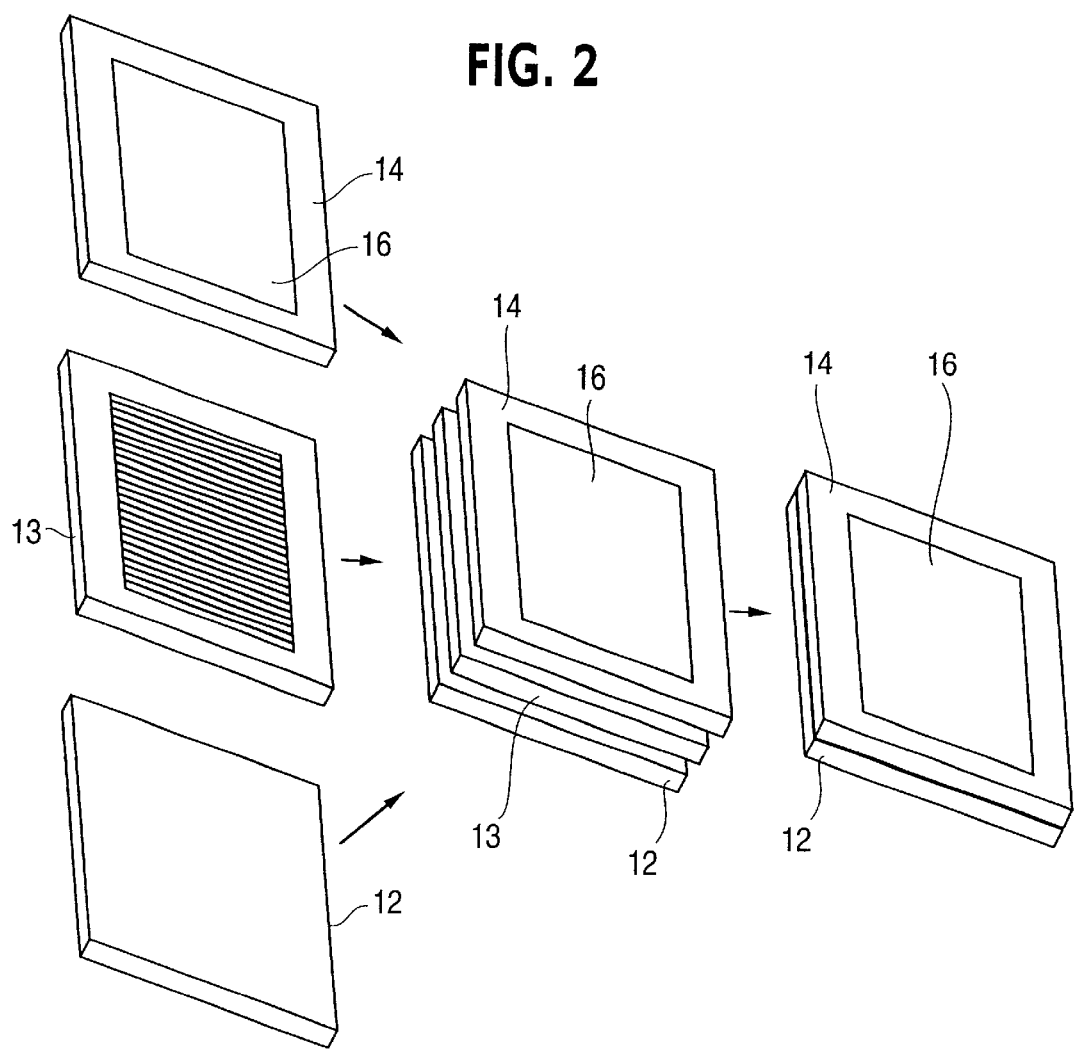

EUV RETICLE CARRIER WITH REMOVABLE PELLICLE

FIELD

The present invention is directed to a carrier for a reticle used in semiconductor manufacturing.

BACKGROUND

The manufacturing of semiconductor chips is an extremely exacting and difficult process. Each chip has many layers and a reticle or photomask is required for each layer that is printed on the wafer. These reticles should have no contamination or dust, in order to avoid defects in the pattern which is formed on the wafer. Traditionally, light has been shined through the photomask in order to form the pattern on the wafer. However, as the patterns on the wafers have gotten smaller and closer together, it is no longer possible to effectively use regular light to form these patterns. That is, the wavelength of regular light is too long to clearly form such small patterns. In order to extend the use of this process to even smaller patterns, other types of light such as deep ultraviolet (248 nm or 193 nm), vacuum ultraviolet (157 nm) and EXTREME ultraviolet (13.4 nm) are being used or are being considered. However, even this shorter wavelength radiation has limits.

Because of the problem of dust and other impurities landing on the reticle during transport, and the possibility of scratches, it is important to have a protective layer. Typically, a pellicle, which is a membrane, is used for this purpose. The use of such a membrane protects the reticle during the transportation and exposure process. However, the use of the pellicle produces additional problems when shorter wavelength radiation is utilized. The shorter wavelength radiation causes the standard pellicle material to burn off or otherwise be destroyed. Thus, if shorter wavelength radiation is to be utilized, it is necessary to find other ways to protect the reticle from the high intensity radiation without destroying the pellicle.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and that the invention is not limited thereto. The spirit and scope of the present invention are limited only by the terms of the appended claims.

The following represents brief descriptions of the drawings, wherein:

FIG. 1 is an example advantageous embodiment of the present invention;

FIG. 2 is an example advantageous embodiment of the present invention in exploded form.

DETAILED DESCRIPTION

Before beginning a detailed description of the subject invention, mention of the following is in order. When appropriate, like reference numerals and characters may be used to designate identical, corresponding or similar components in differing figure drawings. Further, in the detailed description to follow, example sizes/models/values/ranges may be given, although the present invention is not limited to the same.

In the processing of semiconductor wafers it is common to have a manufacturing apparatus which holds dozens of reticles at a time so that it is unnecessary to remove the wafer or reticles from the apparatus while several different layers are being formed. This allows the internal atmosphere of the apparatus to be sealed. This is very important since the apparatus includes a very clean, class 1 environment, to prevent any dust or other imperfections from landing on the wafer and also to protect the reticles. By storing a number of reticles at a time, it is possible to process the wafer without removing it and exposing it to the atmosphere.

The present invention provides a reticle carrier and protection device 10, as shown in FIG. 1. This carrier includes a bottom 12 and a top 14. The top includes a transparent window portion 16. A cover 18 can also be used which is removable when necessary but which otherwise protects the window. An input port 20 and exit port 22 are provided, so that nitrogen or other gas may be used to purge the reticle carrier to prevent impurities from settling on the reticle. Filters (not shown) may also be provided to help remove impurities.

As mentioned previously, it is difficult to provide a pellicle to protect the reticle when using lower wavelength radiation (below 193 nm such as 157 nm). Thus, traditional soft pellicles which are polymer membranes are damaged by lower wavelength radiation. The present invention solves this problem by having a removable pellicle. That is, the pellicle is left in place during transport and during inspection. However, during the exposure step, where the lower wavelength radiation is utilized, the pellicle is removed to avoid any damage thereto.

Thus, in the normal handling of the reticle, the protective lid over the transparent window 16 is closed during transportation. However, the lid may be opened for inspection utilizing DUV (deep ultraviolet) radiation. The transparent window is not harmed by this type of radiation. In addition, it may also be utilized with VUV (vacuum ultraviolet) in the process of photochemical cleaning. By having the transparent window as part of the top of the carrier, it is possible to perform the steps of inspection and photochemical clean without removing the reticle from the carrier.

When the reticle is used to produce a pattern on the semiconductor, the carrier is opened and the reticle removed and used. As soon as exposure is completed, the reticle is returned to the carrier and the top and cover reinstalled. The removal of the reticle and its reinstatement is all done automatically within the class one or better clean environment. By using this system, it is possible to use the transparent window for all the necessary steps except the exposure, which is handled by removing the reticle from the carrier.

FIG. 2 shows an exploded version of the carrier shown in FIG. 1. As seen, the top 14 including window 16 is placed over reticle 13 and on top of bottom 12. The parts are placed together and the top and bottom closed around the reticle. The cover 18 may also be placed over the top cover. The various parts of the carrier should be made of non-out gassing material that generates no particles. The carrier can use mechanical clamping or magnetic sealing to protect a reticle during transport.

Ports can be provided to introduce nitrogen gas or other inert gases to purge and filter any impurities. The ports shown in FIG. 1 may be connected to a single input for each reticle carrier, or a plurality of ports can be connected to a single source.

The carrier may have other design features such as electrostatic dissipation and may have a design which minimizes contact from the reticle surface.

While the device as device described above has a transparent window in the top cover, it would also be possible to provide transparent windows in both the top and bottom if inspection were necessary for the bottom of the reticle.

While the above mentioned wavelengths for the various type of ultraviolet light are those preferred, other wavelengths may also be utilized. For example, for the inspection steps, 266 nm or 193 nm may be utilized.

The reticle carrier described can use any type of top and bottom cover that provides a tight seal.

In concluding, reference in the specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. Furthermore, for ease of understanding, certain method procedures may have been delineated as separate procedures; however, these separately delineated procedures should not be construed as necessarily order dependent in their performance, i.e., some procedures may be able to be performed in an alternative ordering, simultaneously, etc.

This concludes the description of the example embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed:

1. A carrier for a reticle used in semiconductor manufacture, comprising:
   a bottom cover;
   a top cover;
   the bottom cover and the top cover forming a carrier for receiving the recticle;
   a transparent window in at least one of the bottom cover and the top cover to allow visual inspection of an overall reticle mask area, where the transparent window allows deep ultra-violet (DUV) radiation inspection of the reticle mask area of the reticle installed within the carrier, and allows a vacuum ultra-violet (VUV) radiation photochemical cleaning of the reticle mask area of the reticle installed within the carrier, and where the transparent window is DUV and VUV degradation resistant; and,
   at least one of the bottom cover and the top cover enabling removal of the reticle from the carrier during extreme ultra-violet (EUV) or shorter wavelength radiation mask exposure.

2. The reticle carrier according to claim 1, comprising a protective lid for covering the transparent window other than during inspection and cleaning.

3. The reticle carrier according to claim 1, comprising a purge system including at least two ports for receiving and exhausting gas to help prevent impurities from contaminating the reticle.

4. The reticle carrier according to claim 1, comprising the transparent window in each of the bottom cover and the top cover.

5. The reticle carrier according to claim 1, comprising a protective system to protect the carrier from exposure to the EUV or shorter wavelength radiation during mask exposure.

6. A system for handling a reticle during semiconductor manufacture comprising:
   a reticle;
   a reticle carrier for receiving the reticle, the carrier including a transparent window on at least one surface to allow visual inspection of an overall reticle mask area, where the transparent window allows deep ultra-violet (DUV) radiation inspection of the reticle mask area of the reticle installed within the carrier, and allows a vacuum ultra-violet (VUV) radiation photochemical cleaning of the reticle mask area of the reticle installed within the carrier, and where the transparent window is DUV and VUV degradation resistant; and
   a reticle removing apparatus for removing the reticle from the carrier for extreme ultra-violet (EUV) or shorter wavelength radiation mask exposure.

7. The system according to claim 6 wherein the system includes a plurality of such carriers and the removing apparatus is an automated system for removing the reticle from its carrier within an environmentally controlled atmosphere.

8. The system according to claim 6, comprising a protective lid for covering the transparent window when not in use.

9. The system according to claim 6, comprising a purge and filter system for removing impurities during photochemical cleaning from the reticle carrier by introducing gas within the carrier.

10. The system according to claim 6, comprising a second transparent window on a reverse side of the carrier.

11. The system according to claim 6, wherein the system includes an environmentally contained atmosphere and a plurality of carriers with reticles so as to automatically remove and expose reticles in turn within a controlled atmosphere and to perform a series of steps in a manufacturing process without manual intervention.

12. The system according to claim 6 wherein the system includes a protective system to protect the carrier from exposure to the EUV or shorter wavelength radiation during mask exposure.

13. A method of handling a reticle in a semiconductor manufacturing process, comprising:
   providing a carrier for the reticle;
   providing a transparent window in at least one surface of the carrier to allow visual inspection of an overall reticle mask area, where the transparent window allows deep ultra-violet (DUV) radiation inspection of the reticle mask area of the reticle installed within the carrier, and allows a vacuum ultra-violet (VUV) radiation photochemical cleaning of the reticle mask area of the reticle installed within the carrier, and where the transparent window is DUV and VUV degradation resistant;

storing the carrier in an environmentally controlled atmosphere during the semiconductor manufacturing process; and removing the reticle from the carrier during extreme ultra-violet (EUV) or shorter wavelength radiation mask exposure and returning it to the carrier, all within the environmentally protected atmosphere.

14. The method according to claim 13, comprising, providing a protective lid for covering the transparent window when not in use.

15. The method according to claim 13, wherein the carrier includes a purging and filtering system for removing impurities.

16. The method according to claim 13, comprising providing a second transparent window on another surface of the carrier.

17. The method according to claim 13, comprising storing additional reticles in carriers within the atmosphere so as to conduct a series of steps in the manufacturing process without removing the reticles from the atmosphere.

18. The method according to claim 14, wherein the purging and filtering system uses nitrogen gas.

19. The method according to claim 13, comprising protecting the carrier from exposure to the EUV or shorter wavelength radiation during mask exposure.

* * * * *